(12) United States Patent
Asao

(10) Patent No.: US 10,553,791 B2
(45) Date of Patent: Feb. 4, 2020

(54) SEMICONDUCTOR STORAGE DEVICE

(71) Applicant: KABUSHIKI KAISHA TOSHIBA, Minato-ku (JP)

(72) Inventor: Yoshiaki Asao, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/908,262

(22) Filed: Feb. 28, 2018

(65) Prior Publication Data

US 2018/0254412 A1   Sep. 6, 2018

(30) Foreign Application Priority Data

Mar. 1, 2017 (JP) ................................. 2017-038335

(51) Int. Cl.
*H01L 45/00* (2006.01)
*G11C 13/00* (2006.01)
*H01L 27/24* (2006.01)

(52) U.S. Cl.
CPC ............ *H01L 45/06* (2013.01); *G11C 13/003* (2013.01); *G11C 13/0004* (2013.01); *G11C 13/0009* (2013.01); *G11C 13/0033* (2013.01); *H01L 27/2427* (2013.01); *H01L 45/126* (2013.01); *H01L 45/1253* (2013.01);
(Continued)

(58) Field of Classification Search
CPC ... H01L 45/06; H01L 45/1253; H01L 45/144; H01L 45/141; H01L 45/1233; G11C 13/0009; G11C 13/003; G11C 13/0033
See application file for complete search history.

(56) References Cited

U.S. PATENT DOCUMENTS 7,476,892 B2   1/2009   Suh et al.
7,705,343 B2   4/2010   Suh et al.
(Continued)

FOREIGN PATENT DOCUMENTS

JP   2006-339642   12/2006
JP   2012-84765    4/2012
(Continued)

OTHER PUBLICATIONS

Azer Faraclas, et al. "Modeling of Thermoelectric Effects in Phase Change Memory Cells", IEEE Transactions on Electron Devices (vol. 61, No. 2), 2014, pp. 372-378.
(Continued)

*Primary Examiner* — Patricia D Reddington
(74) *Attorney, Agent, or Firm* — Oblon, McClelland, Maier & Neustadt, L.L.P.

(57) ABSTRACT

According to one embodiment, a semiconductor includes a first wiring, a second wiring, a first electrode, a second electrode and a memory cell. The first wiring extends in a first direction. The second wiring extends in a second direction crossing the first direction. The first electrode is connected to the first wiring. The second electrode is connected to the second wiring. The memory cell is arranged between the first electrode and the second electrode. The memory cell includes a memory element electrically connected to the first electrode, and a selector provided between the memory element and the second electrode and electrically connected to the second electrode, and the memory element and the selector are of a same conductivity type.

9 Claims, 12 Drawing Sheets

(52) U.S. Cl.
CPC ........ *H01L 45/144* (2013.01); *G11C 2213/76* (2013.01); *H01L 45/1233* (2013.01); *H01L 45/141* (2013.01)

(56) References Cited

U.S. PATENT DOCUMENTS

| | | | |
|---|---|---|---|
| 8,853,663 B2 | 10/2014 | Sumino | |
| 2006/0266993 A1* | 11/2006 | Suh | H01L 27/2436 257/4 |
| 2007/0029676 A1* | 2/2007 | Takaura | G11C 13/0004 257/758 |
| 2015/0028280 A1* | 1/2015 | Sciarrillo | H01L 45/04 257/4 |
| 2018/0182958 A1* | 6/2018 | Gealy | H01L 45/06 |

FOREIGN PATENT DOCUMENTS

| | | |
|---|---|---|
| JP | 5073267 | 11/2012 |
| WO | WO 2016/118160 A1 | 7/2016 |

OTHER PUBLICATIONS

DerChang Kau, et al. "A stackable cross point phase change memory", 2009 IEEE International Electron Devices Meeting (IEDM), 2009, pp. 27.1.1-27.1.4 (pp. 617-620).

Jaeho Lee, et al. "Impact of thermoelectric phenomena on phase-change memory performance metrics and scaling", Nanotechnology (vol. 23, No. 20), 2012, pp. 1-7.

Dong-Seok Suh, et al. "Thermoelectric heating of $Ge_2Sb_2Te_5$ in phase change memory devices", Applied Physics Letters (vol. 96, No. 12), 2010, pp. (123115-1)-(123115-3).

\* cited by examiner

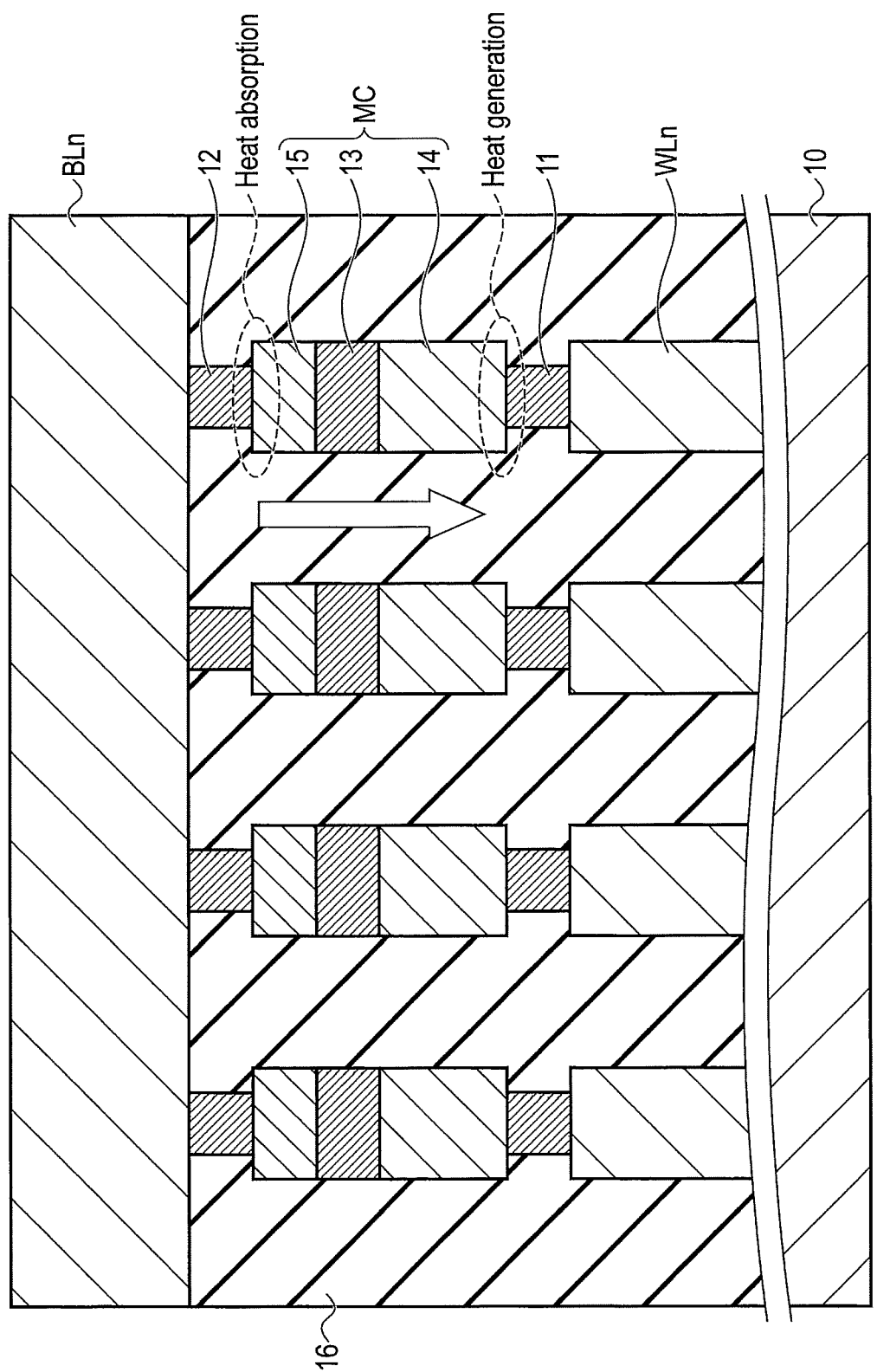
F I G. 2

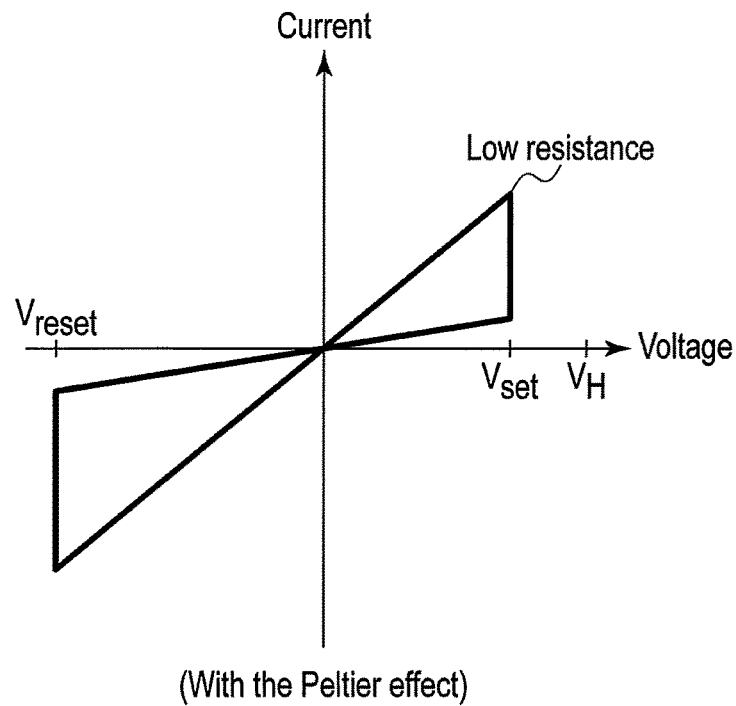
F I G. 6A
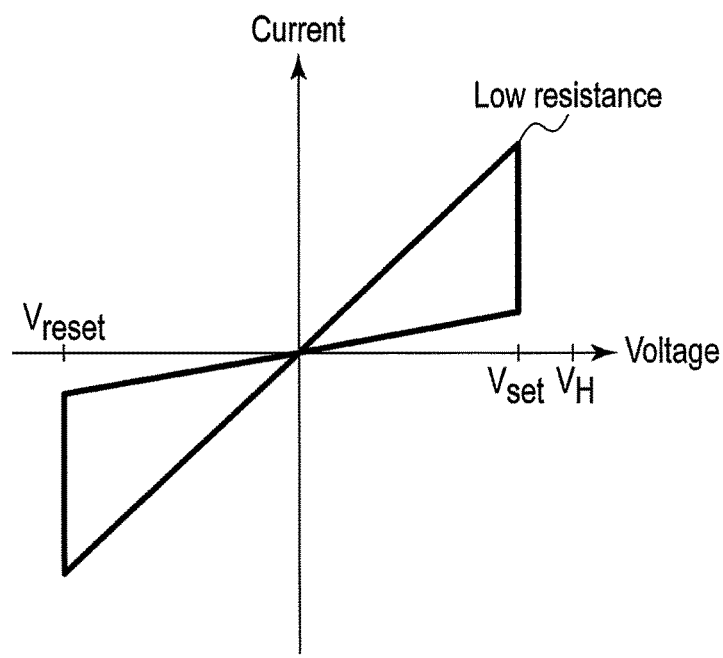
F I G. 6B

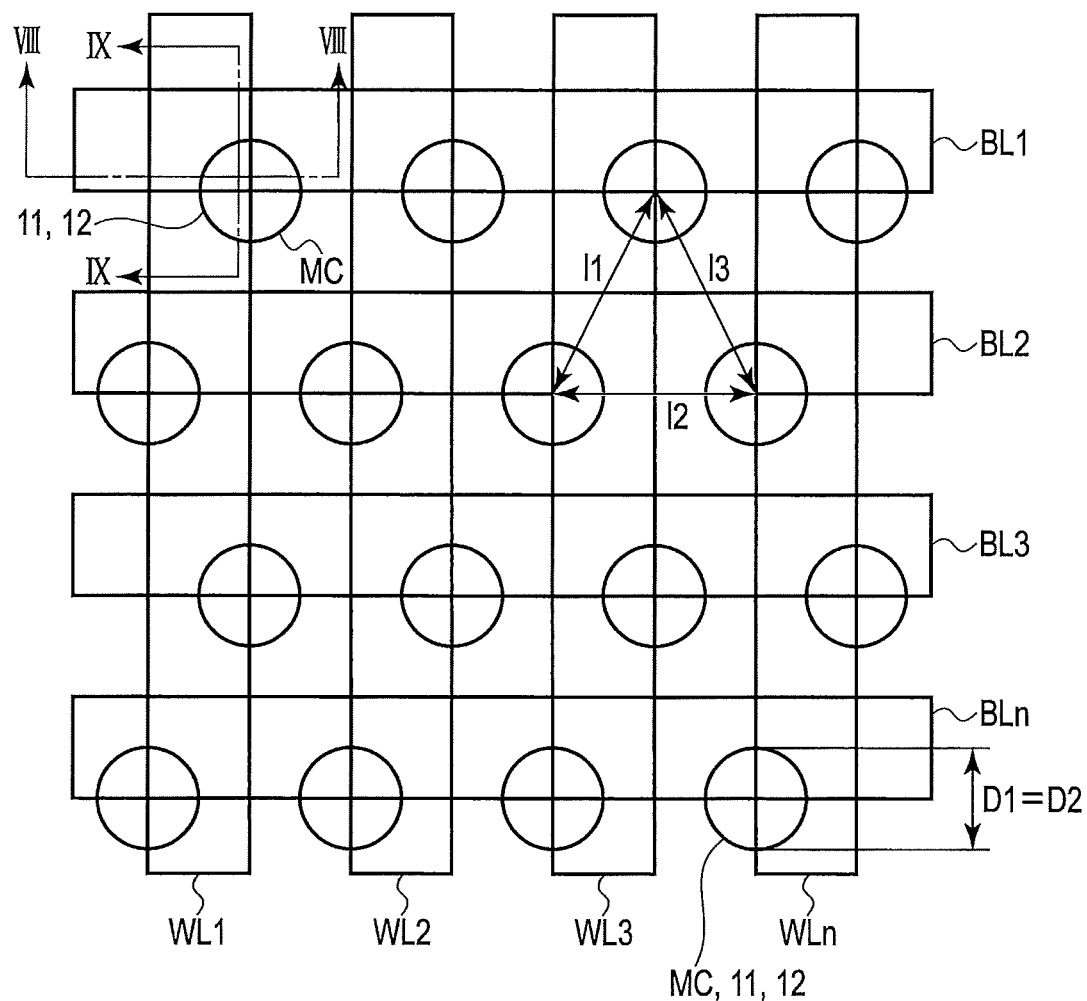
F I G. 7

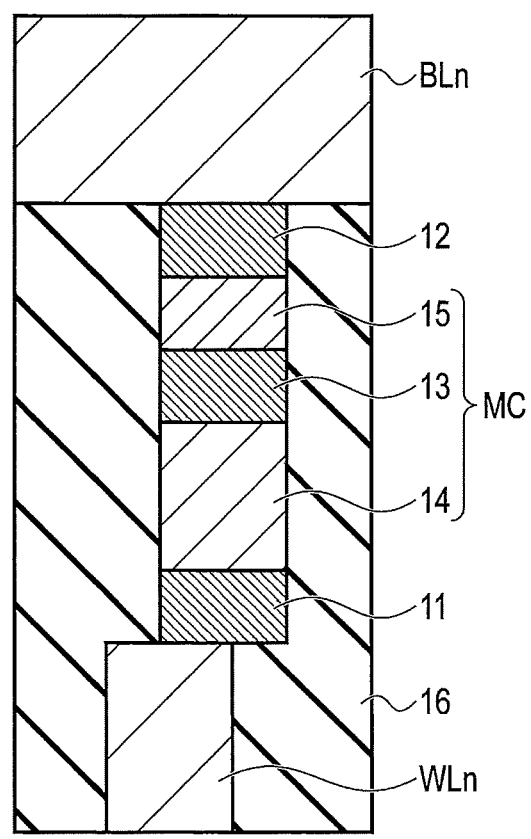
F I G. 8

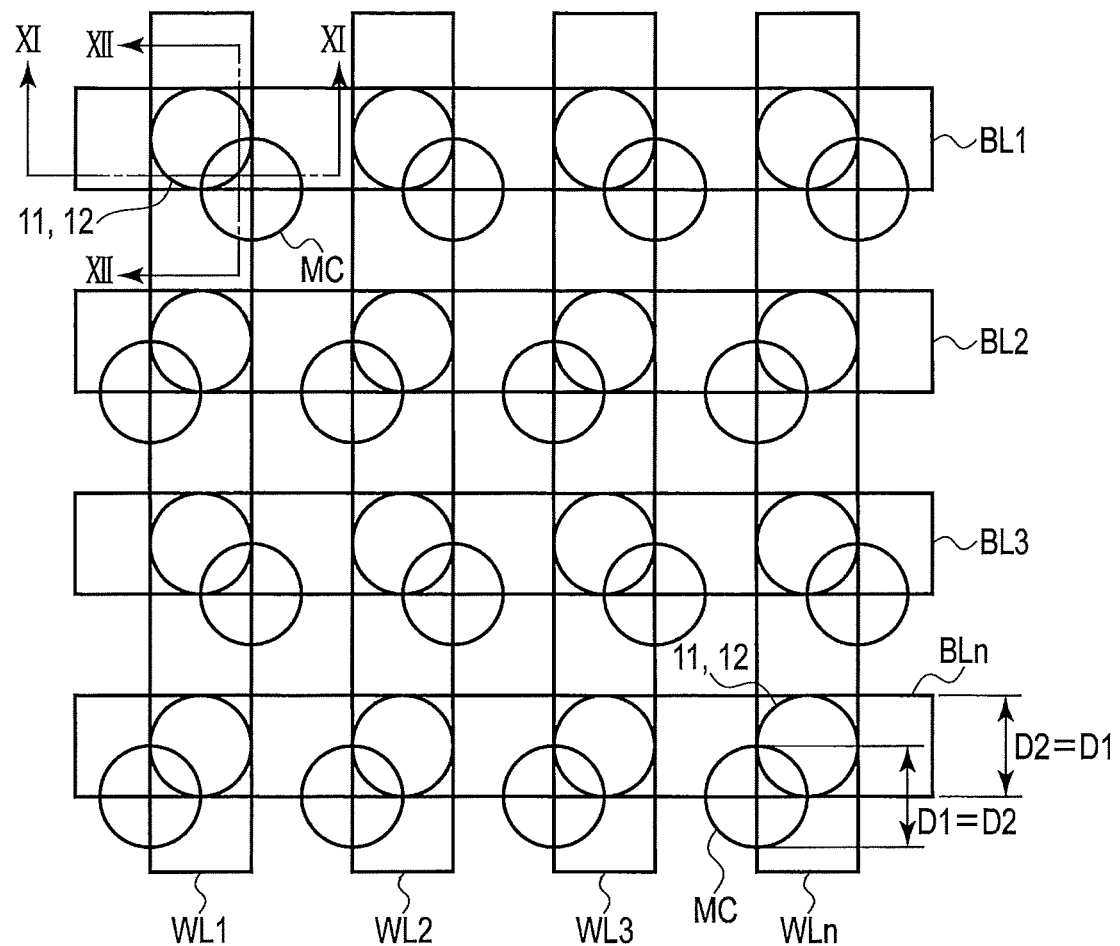
F I G. 10

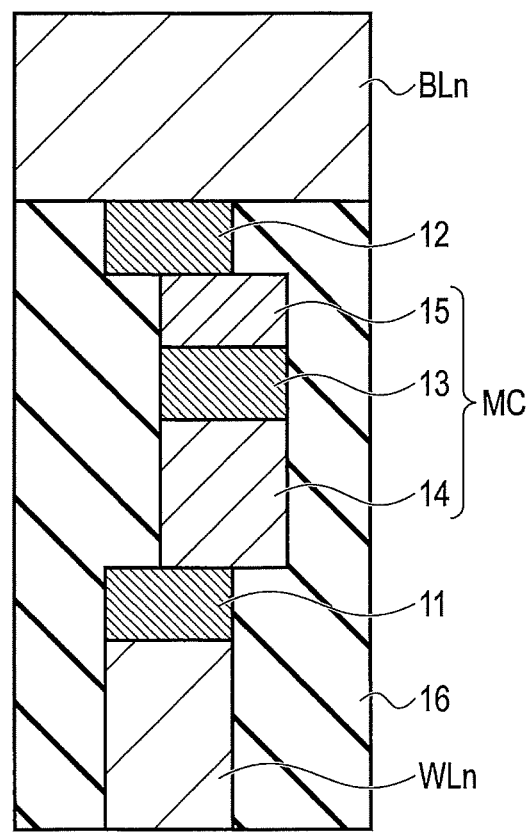
F I G. 11

SEMICONDUCTOR STORAGE DEVICE

CROSS-REFERENCE TO RELATED APPLICATIONS

This application is based upon and claims the benefit of priority from Japanese Patent Application No. 2017-038335, filed Mar. 1, 2017, the entire contents of which are incorporated herein by reference.

FIELD

Embodiments described herein relate generally to a semiconductor storage device, for example.

BACKGROUND

For example, a semiconductor storage device which stores information by changing the resistance of a storage layer has been proposed. A phase-change random access memory (PcRAM) is known as an example of the semiconductor storage device. The phase-change random access memory stores information by applying current or voltage to a memory element formed of a phase-change material and changing the memory element to an amorphous phase showing a high resistance or a crystalline phase showing a low resistance.

In a write cycle of the phase-change memory, due to relationships in voltage among a selected bit line, a selected word line, a non-selected bit line and a non-selected word, write disturb occurs in a non-selected cell and a half-selected cell which is slightly selected. However, if current or voltage to the selected cell is reduced for the sake of preventing write disturb, a write error occurs in the selected cell. Therefore, there has been a demand for a semiconductor storage device which can prevent write disturb in a non-selected cell and a half-selected cell and can also prevent a write error in a selected cell.

BRIEF DESCRIPTION OF THE DRAWINGS

FIG. 2 is a sectional view taken along line II-II of FIG. 1.

FIG. 6A is an explanatory diagram showing an operation of the first embodiment and showing an example of the VI characteristic which explains an operation with the Peltier effect.

FIG. 6B is an explanatory diagram showing the VI characteristic which explains an operation without the Peltier effect as a comparative example.

FIG. 7 is a schematic plan view of a semiconductor storage device according to the second embodiment.

FIG. 8 is a sectional view taken along line VIII-VIII of FIG. 7.

FIG. 10 is a schematic plan view of a modification of the semiconductor storage device according to the second embodiment.

FIG. 11 is a sectional view taken along line XI-XI of FIG. 10.

DETAILED DESCRIPTION

Figure 1:
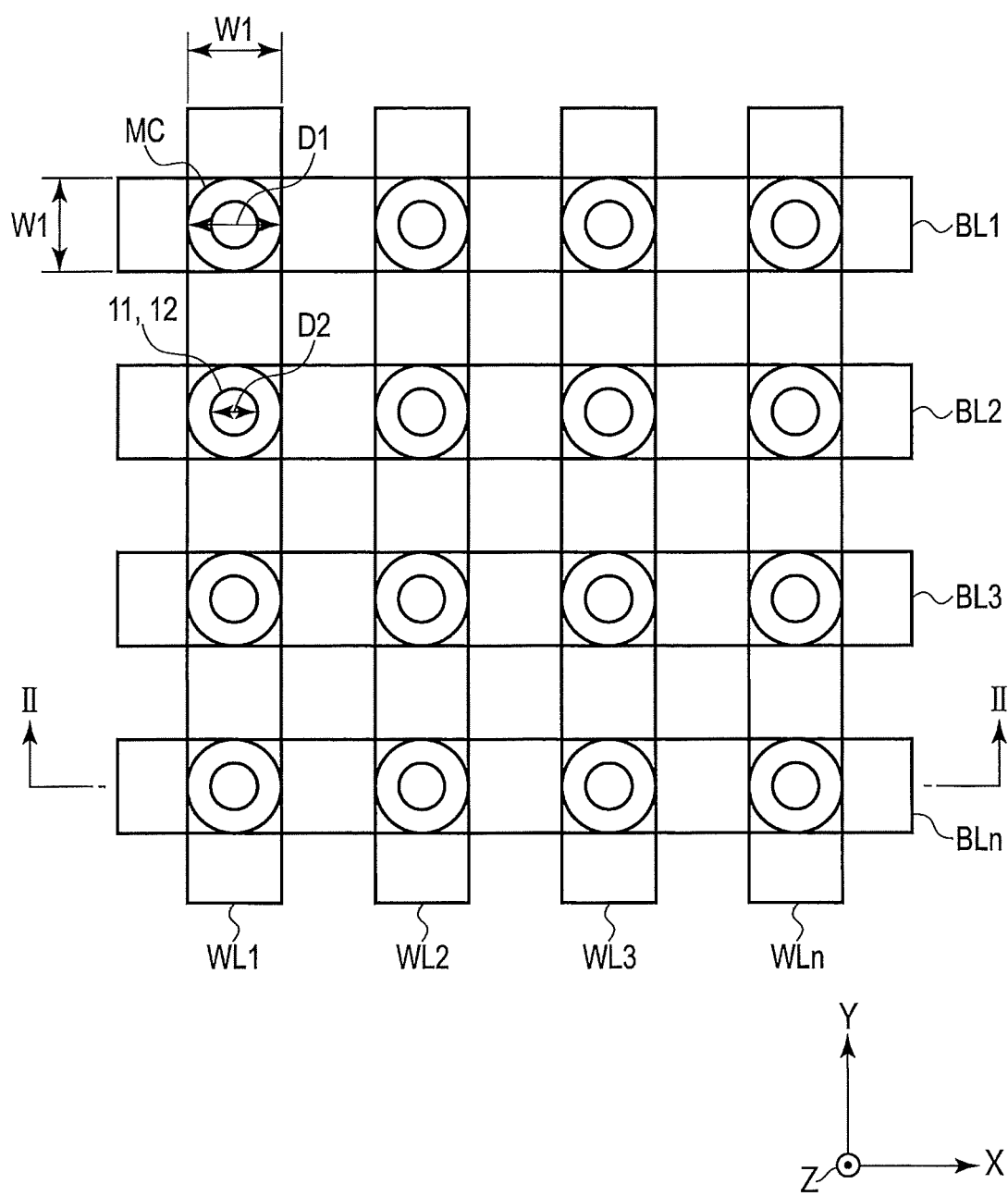
FIG. 1 is a schematic plan view of a semiconductor storage device according to the first embodiment.

In general, according to one embodiment, a semiconductor includes a first wiring, a second wiring, a first electrode, a second electrode and a memory cell. The first wiring extends in a first direction. The second wiring extends in a second direction crossing the first direction. The first electrode is connected to the first wiring. The second electrode is connected to the second wiring. The memory cell is arranged between the first electrode and the second electrode. The memory cell includes a memory element electrically connected to the first electrode, and a selector provided between the memory element and the second electrode and electrically connected to the second electrode, and the memory element and the selector are of the same conductivity type.

Embodiments will be described hereinafter with reference to the accompanying drawings. Note that the same portions are denoted by the same reference numbers in the drawing.

(First Embodiment)

FIGS. 1 and 2 schematically show a memory cell array of a semiconductor storage device according to the first embodiment.

As shown in FIGS. 1 and 2, peripheral circuits which will be described later are formed in a semiconductor substrate 10, for example. The peripheral circuits include a row decoder, a column decoder, a voltage generation circuit, a read circuit, etc., for example.

As shown in FIG. 1, a plurality of word lines WL1, WL2, WL3, . . . , WLn (n is a natural number) (hereinafter also referred to simply as word lines WLn) are provided as first wirings above the semiconductor substrate 10, and a plurality of bit lines BL1, BL2, BL3, . . . , BLn (n is a natural number) (hereinafter also referred to simply as bit lines BLn) are provided as second wirings above the word lines WLn in such a manner as to cross the word lines WLn. Memory cells MC are provided between the word lines WLn and the bit lines BLn, respectively. The bit lines BLn extend in a first direction, i.e., an X direction in the drawing, for example, the word lines WLn extend in a second direction, i.e., a Y direction in the drawing, for example, and the memory cells MC are provided in a third direction crossing the first direction and the second direction and being perpendicular to the plane of paper, i.e., a Z direction in the drawing, for example.

As shown in FIG. 2, each memory cell MC is arranged between a first electrode 11 as a lower electrode and a second electrode 12 as an upper electrode. The first electrode 11 is connected to the corresponding word line WLn, and the second electrode 12 is connected to the corresponding bit line BLn. Between the first electrode 11 and the second electrode 12, a memory element 14, a third electrode 13 as an intermediate electrode and a selector 15, which constitute the memory cell MC, are connected in series. That is, the memory element 14 is arranged between the first electrode 11 and the third electrode 13, and the selector 15 is arranged between the third electrode 13 and the second electrode 12.

Here, the memory cell MC includes the memory element 14 and the selector 15 and has selectivity.

The selector 15 is not a unidirectional diode such as a diode using a PN junction but is composed of a bidirectional diode such as an ovonic threshold switch (OTS).

The third electrode 13 separates the material of the memory element 14 and the material of the selector 15 from each other and electrically connects the memory element 14 and the selector 15 to each other.

The word line WLn, the first electrode 11, the memory cell MC, the second electrode 12 and the bit line BLn are provided inside an insulating layer 16 provided on the semiconductor substrate 10.

As shown in FIG. 1, the memory cell MC has a diameter D1, for example. A diameter D2 of the first electrode 11 and the second electrode 12 is less than the diameter D1 of the memory cell MC and a width W1 of the word line WLn and the bit line BLn. Therefore, as shown in FIG. 2, the first electrode 11 contacts part of the word line WLn and part of the memory element 14, and the second electrode 12 contacts part of the bit line BLn and part of the selector 15.

When the diameter D2 of the first electrode 11 and the second electrode 12 is less than the diameter D1 of the memory cell MC as described above, current flowing through the memory cell MC can be concentrated into the range of the diameter D2 of the first electrode 11 and the second electrode 12, and the Peltier effect which will be described later can be improved.

The word line WLn and the bit line BLn are formed of tungsten, for example, and the first electrode 11, the second electrode 12 and the third electrode 13 are also formed of tungsten, for example. However, the first electrode 11, the second electrode 12 and the third electrode 13 are not limited to tungsten and may be formed of a material having a lower Seebeck coefficient as compared to the materials of the memory element 14 and the selector 15, such as titanium or titanium nitride. Further, the first electrode 11, the second electrode 12 and the third electrode 13 are not limited to a single material and may be formed of a plurality of materials which are stacked on top of another.

The memory element 14 is formed of a p-type phase-change material such as $Ge_2Sb_2Te_5$, $Sb_2Te_3$, GaSb or GeTe. The selector 15 is formed of a p-type OTS such as GeSe to which Ag is added, AgGeSnSe, GeCuSe or GeNaSe. The memory element 14 and the selector 15 are not limited to chalcogen-based materials and may be formed of materials having a higher Seebeck coefficient as compared to the material of the first electrode 11, the second electrode 12 and the third electrode 13, for example.

The first electrode 11 as a metal electrode contacts the memory element 14 formed of a p-type phase-change material, and the second electrode 12 as a metal electrode contacts the selector 15 formed of a p-type OTS. Therefore, in a set operation (write operation), if current flows from the second electrode 12 to the first electrode 11 as shown by an arrow in FIG. 2, heat is absorbed at the interface of the second electrode 12 and the selector 15 by the Peltier effect, and heat is generated at the interface of the first electrode 11 and the memory element 14 by the Peltier effect. The peltier effect is heat generation or heat absorption at the junction when current flows through the junction of two types of conductors having the same temperature. The set operation of the memory cell MC will be described later.

Figure 3:
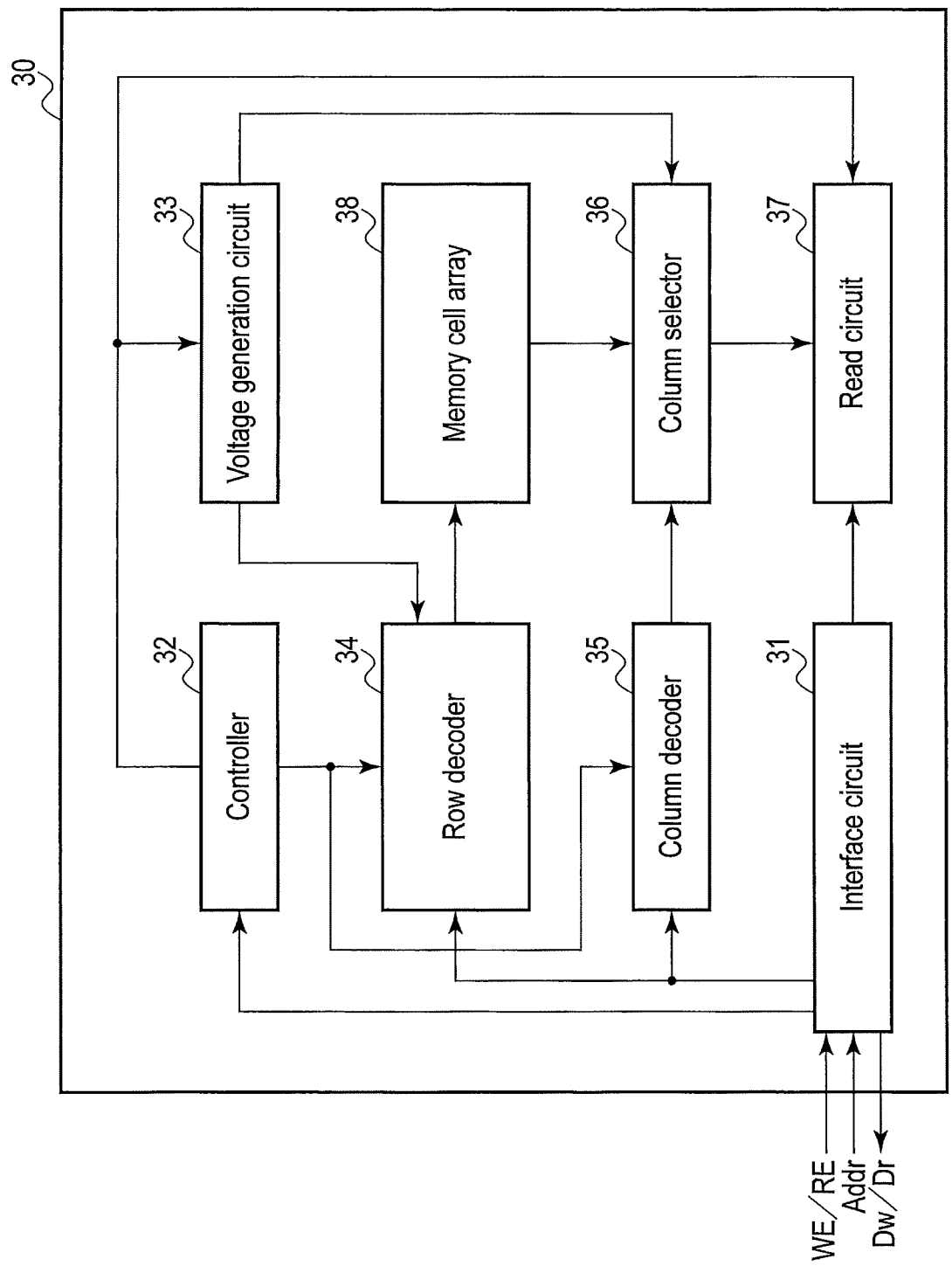
FIG. 3 is a schematic diagram showing the configuration of a control system of the semiconductor storage device according to the first embodiment.

FIG. 3 shows an example of the configuration of a control system of the semiconductor storage device according to the first embodiment. The configuration of the control system is not limited to this configuration and can be modified.

The semiconductor storage device 30 includes an interface circuit 31, a controller 32, a voltage generation circuit 33, a row decoder 34, a column decoder 35, a column selector 36, a read circuit 37 and a memory cell array 38.

For example, a write enable signal WE, a read enable signal RE, an address signal Addr and write data Dw are supplied from the outside of the semiconductor storage device 30 to the interface circuit 31. Read data Dr is output from the interface circuit 31 to the outside of the semiconductor storage device 30.

The write enable signal WE and the read enable signal RE are transferred from the interface circuit 31 to the controller 32.

The controller 32 controls the operations of the voltage generation circuit 33, the row decoder 34, the column decoder 35 and the read circuit 37.

For example, when the controller 32 receives the write enable signal WE, the controller 32 sets the voltage generation circuit 33, the row decoder 34 and the column decoder 35 to an operating state and sets the read circuit 37 to a non-operating state, and executes a write operation.

Further, for example, when the controller 32 receives the read enable signal RE, the controller 32 sets the voltage generation circuit 33, the row decoder 34, the column decoder 35 and the read circuit 37 to an operating state, and executes a read operation.

The address signal Addr is transferred from the interface circuit 31 to the row decoder 34 and the column decoder 35.

The row decoder 34 selects one of the word lines WLn of the memory cell array 38 based on the address signal Addr. The column decoder 35 selects one of the bit lines BLn of the memory cell array 38 based on the address signal Addr by using the column selector 36.

In a data write operation or a data read operation, the voltage generation circuit 33 generates a predetermined voltage for controlling a write operation or a read operation of a memory cell, and supplies the predetermined voltage to the row decoder 34 and the column selector 36.

(Operation)

The operation of the first embodiment will be described with reference to FIGS. 4, 5, 6A and 6B.

Figure 4:
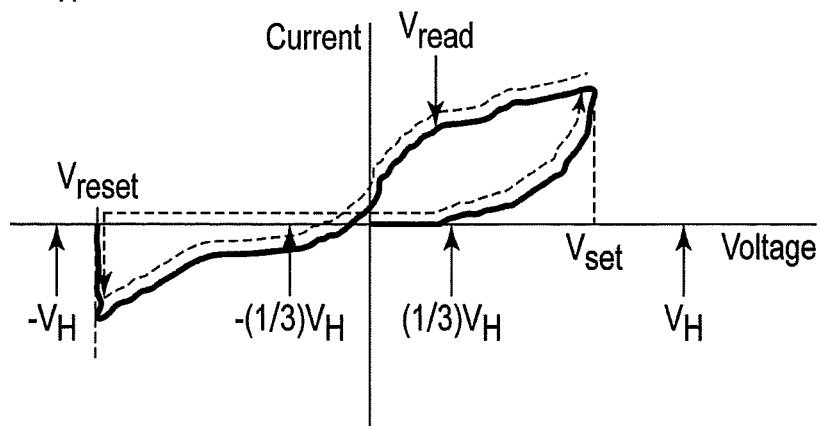
FIG. 4 is a diagram showing an example of the biasing method applied to the first embodiment and showing a voltage-current (VI) characteristic.
Figure 5:
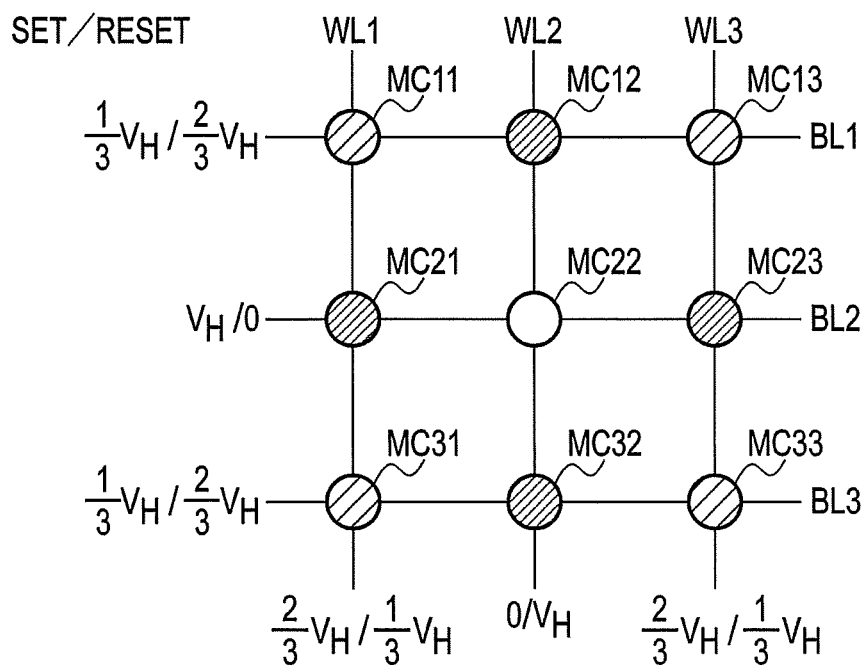
FIG. 5 is a diagram showing an example of the biasing method applied to the first embodiment and showing a relationship in voltage among elements.

FIGS. 4 and 5 show an example of a biasing method applied to the first embodiment. In the first embodiment, for example, a (⅓) $V_H$ method is applied as the biasing method. Here, a voltage $V_H$ is the high level of a power supply voltage used in the semiconductor storage device 30, for example, but this is in no way restrictive. One third of the voltage $V_H$ is indicated as (⅓) $V_H$.

However, the first embodiment is not limited to the (⅓) $V_H$ method and may adopt a biasing method using a voltage less than or equal to (⅓) $V_H$ such as (1/3.5) $V_H$ or (¼) $V_H$.

FIG. 4 shows an example of the voltage-current (VI) characteristic of the (⅓) $V_H$ method. A voltage at which the memory cell MC transitions from a high resistance to a low resistance is indicated as Vset, and a voltage at which the memory cell MC transitions from a low resistance to a high resistance is indicated as Vreset. A voltage applied to a memory cell selected in a data read operation is indicated as Vread.

FIG. 5 shows the voltages of elements in a set operation (referred to also as a write operation) and a reset operation. The set operation is an operation of changing the memory cell MC from a high resistance to a low resistance, and the reset operation is an operation of changing the memory cell MC from a low resistance to a high resistance. FIG. 5 shows memory cells MC11 to MC33 connected to the bit lines BL1, BL2 and BL3 and the word lines WL1, WL2 and WL3 as a representative example.

As shown in FIG. 5, in the set operation, a voltage $V_H$ is applied to the bit line BL2 connected to the selected cell MC22, and a ground potential (0 V) is applied to the word line WL2. That is, the potential difference between the bit line BL2 and the word line WL2 is set to $V_H$.

Further, a voltage ($\frac{1}{3}$) $V_H$ is applied to the bit lines BL1 and BL3 adjacent to the bit line BL2, and a voltage ($\frac{2}{3}$) $V_H$ is applied to the word lines WL1 and WL3 adjacent to the word line WL2. Therefore, the potential difference between the bit line BL1 and the word line WL1 and between the bit line BL3 and the word line WL3 are ($\frac{1}{3}$) $V_H$–($\frac{2}{3}$) $V_H$=–($\frac{1}{3}$) $V_H$, and the memory cells MC11, MC13, MC31 and MC33 are reverse-biased. Consequently, the memory cells MC11, MC13, MC31 and MC33 are non-selected cells.

Still further, the potential difference between the bit lines BL1 and BL3 and the word line WL2 is ($\frac{1}{3}$) $V_H$, and the potential difference between the bit line BL2 and the word lines WL1 and WL3 is also ($\frac{1}{3}$) $V_H$. Therefore, the memory cells MC12, MC21, MC23 and MC32 are weakly forward-biased, and are half-selected cells.

In the selected cell MC22, current flows from the bit line BL2 to the word line WL2 when the above-described voltage is applied. More specifically, current flows in the direction of the arrow shown in FIG. 2. At the interface of the second electrode 12 and the selector 15, heat is absorbed by the Peltier effect and impact ionization is promoted. That is, electrons accelerated by an electric field collide with a crystal lattice, and generation of electrons and positive holes is promoted. As a result, the resistance of the selector 15 decreases, and the current flowing into the selector 15 increases. Further, heat is generated at the interface of the first electrode 11 and the memory element 14 by the Peltier effect.

Note that heat is also generated at the interface of the selector 15 and the third electrode 13 by the Peltier effect and heat is also absorbed at the interface of the third electrode 13 and the memory element 14 by the Peltier effect. However, the contact area between the selector 15 and the third electrode 13 and between the third electrode 13 and the memory element 14 is greater as compared to the contact area between the second electrode 12 and the selector 15 and the contact area between the first electrode 11 and the memory element 14. Therefore, the third electrode 13 produces a relatively small current crowding effect as compared to the first electrode 11 and the second electrode 12, and the heat generation and the heat absorption in the third electrode 13 by the Peltier effect are negligible as compared to the heat generation between the first electrode 11 and the memory element 14 and the heat absorption between the second electrode 12 and the selector 15.

FIG. 6A shows an example of the VI characteristic of the selected cell with the Peltier effect according to the first embodiment, and FIG. 6B shows the VI characteristic of the selected cell without the Peltier effect according to a comparative example.

As shown in FIG. 6A, in the first embodiment, heat is absorbed by the Peltier effect and impact ionization is promoted at the interface of the second electrode 12 and the selector 15 of the selected cell. Hence, the VI characteristic shifts to the negative voltage side as compared to the case without the Peltier effect shown in FIG. 6B. Therefore, the switching voltage (Vset) and the negative-voltage-side switching voltage (Vreset) of the memory element 14 as the phase-change material decrease as compared to the case without the Peltier effect. Consequently, the memory element 14 is set to a low resistance by a low switching voltage (Vset) in the case with the Peltier effect as compared to the case without the Peltier effect. That is, in the selected cell MC22 to which a positive voltage is applied, the VI characteristics shifts to the negative voltage side by the Peltier effect and the switching voltage (Vset) decreases, and write efficiency improves, accordingly.

Further, in the non-selected cells MC11, MC13, MC31 and MC33 to which a negative voltage (–($\frac{1}{3}$) $V_H$) is applied and which are reverse-biased, the switching voltage (Vset) and the switching voltage (Vreset) increase. Therefore, current does not flow into the non-selected cells MC11, MC13, MC31 and MC33, and write disturb is prevented.

Still further, the half-selected cells MC12, MC21, MC23 and MC32 to which a positive voltage (($\frac{1}{3}$) $V_H$) is applied are forward-biased. However, since the voltage applied to the half-selected cells MC12, MC21, MC23 and MC32 is one third of the voltage applied to the selected cell MC22, the Peltier effect in the half-selected cells MC12, MC21, MC23 and MC32 is small, and the shift of the VI characteristic to the negative voltage side such as that shown in FIG. 6A hardly occurs. Therefore, the amount of current flowing into the selectors 15 of the half-selected cells MC12, MC21, MC23 and MC32 is small, and the switching voltage (Vset) of the memory element 14 is high as compared to that of the selected cell MC22. Consequently, write disturb is prevented in the half-selected cells MC12, MC21, MC23 and MC32.

According to the first embodiment, the selector 15 and the memory element 14 as a phase-change material are formed of materials of the same conductivity type, and in a write operation, heat is absorbed at the interface of the second electrode 12 and the selector 15 of the selected cell MC22, and heat is generated at the interface of the first electrode 11 and the memory element 14 of the selected cell MC22. Therefore, the switching voltage (Vset) of the selected cell MC22 can be reduced, and write efficiency can be improved. On the other hand, the switching voltage (Vset) is increased in the non-selected cells MC11, MC13, MC31 and MC33 to which a reverse bias is applied, and the switching voltage (Vset) is slightly reduced in the half-selected cells MC12, MC21, MC23 and MC32 to which a weak forward bias is applied. Therefore, a write operation will not be performed in the non-selected cells MC11, MC13, MC31 and MC33 and the half-selected cells MC12, MC21, MC23 and MC32, and write disturb can be prevented.

Further, the diameter D2 of the first electrode 11 and the second electrode 12 is less than the diameter D1 of the memory cell MC. Therefore, the first electrode 11 contacts part of the memory element 14, and the second electrode 12 contacts part of the selector 15, and therefore current can be concentrated into the selector 15 and the memory element 14. Consequently, the Peltier effect can be promoted in the selector 15 and the memory element 14.

(Second Embodiment)

Figure 9:
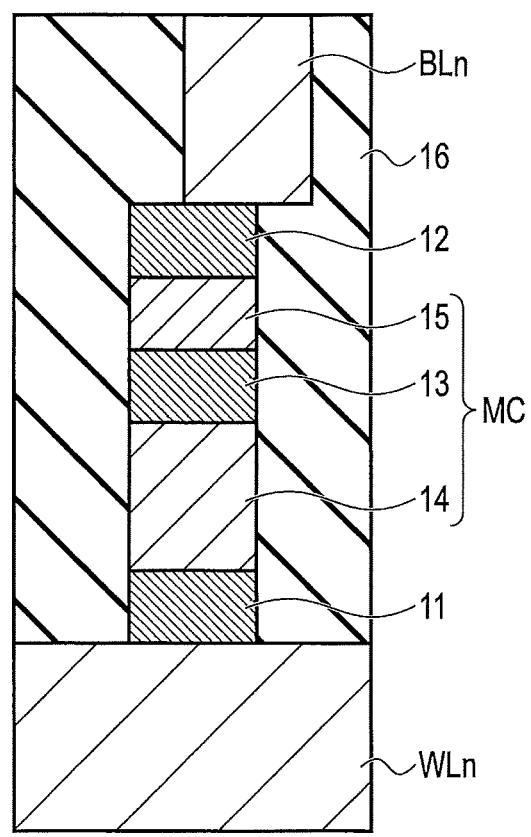
FIG. 9 is a sectional view taken long line IX-IX of FIG. 7.

FIGS. 7, 8 and 9 show the second embodiment.

In the first embodiment, the memory cell MC is arranged at the intersection of the bit line BLn and the word line WLn, the diameter D2 of the first electrode 11 and the second electrode 12 is less than the diameter D1 of the memory cell MC, the first electrode 11 contacts part of the memory cell 14, and the second electrode 12 contacts part of the selector 15.

On the other hand, in the second embodiment, the diameter of the first electrode 11 and the second electrode 12 is equal to the diameter of the memory cell MC, and the memory cell MC is arranged in a location away from the intersection of the bit line BLn and the word line WLn.

As shown in FIG. 7, the diameter D2 of the first electrode 11 and the second electrode 12 is equal to the diameter D1 of the memory cell MC. The memory cell MC is arranged in a location away from the intersection of the bit line BLn and the word line WLn. That is, the memory cells MC are shifted in the direction of the word lines by one half of the diameter D1, and the memory cells connected to the adjacent bit lines are alternately shifted in the direction of the bit lines by one half of the diameter D1. According to this arrangement, three adjacent memory cells are arranged at regular intervals. That is, if the distances among the three memory cells are represented as 11, 12 and 13, the relationship can be set to 11=12=13.

FIGS. 8 and 9 show cross-sections of part of FIG. 7. The first electrode 11, the memory cell MC and the second electrode 12 are stacked in order. The first electrode 11 contacts part of the word line WLn as shown in FIG. 8, and the second electrode 12 contacts part of the bit line BLn as shown in FIG. 9. Therefore, current can be concentrated into part of the memory element 14 and part of the selector 15.

In the second embodiment, the write operation is the same as that of the first embodiment.

According to the second embodiment, the same effect as that produced from the first embodiment can be produced. Further, according to the second embodiment, since the diameter D2 of the first electrode 11 and the second electrode 12 is equal to the diameter D1 of the memory cell MC, manufacture can be simplified as compared to the first embodiment.

Further, when the three adjacent memory cells are arranged at regular intervals, interference of lithography can be prevented in the manufacture of the semiconductor storage device. Therefore, a fine memory cell can be reliably manufactured.

(Modification of Second Embodiment)

Figure 12:
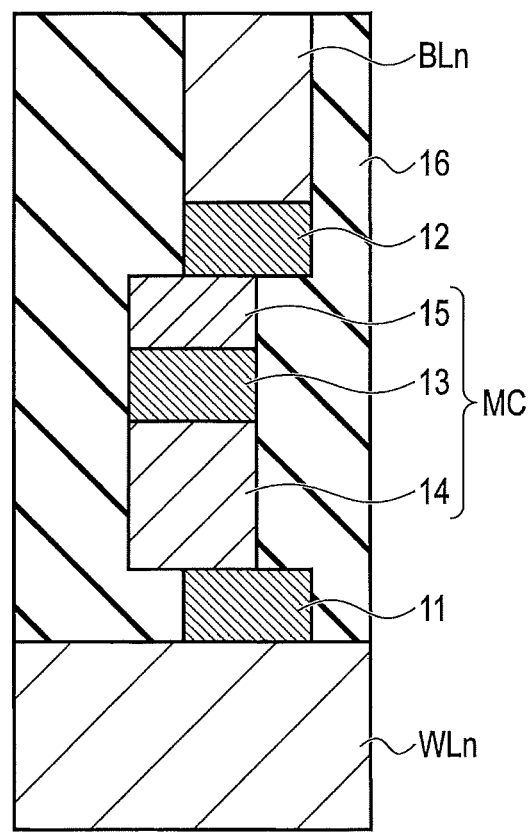
FIG. 12 is a sectional view taken along line XII-XII of FIG. 10.

FIGS. 10, 11 and 12 show a modification of the second embodiment.

In the second embodiment, part of the first electrode 11 contacts part of the word line WLn, and part of the second electrode 12 contacts part of the bit line BLn.

On the other hand, in the modification, the first electrode 11 is not deviated but is brought into contact with the word line WLn, the second electrode 12 is not deviated but is brought into contact with the bit line BLn, and the memory cell MC is deviated from the first electrode 11 and the second electrode 12. That is, part of the memory element 14 of the memory cell MC contacts part of the first electrode 11, and part of the selector 15 contacts part of the second electrode 12.

According to the above-described modification, the same effect as those produced from the first and second embodiments can be produced.

(Third Embodiment)

Figure 13:
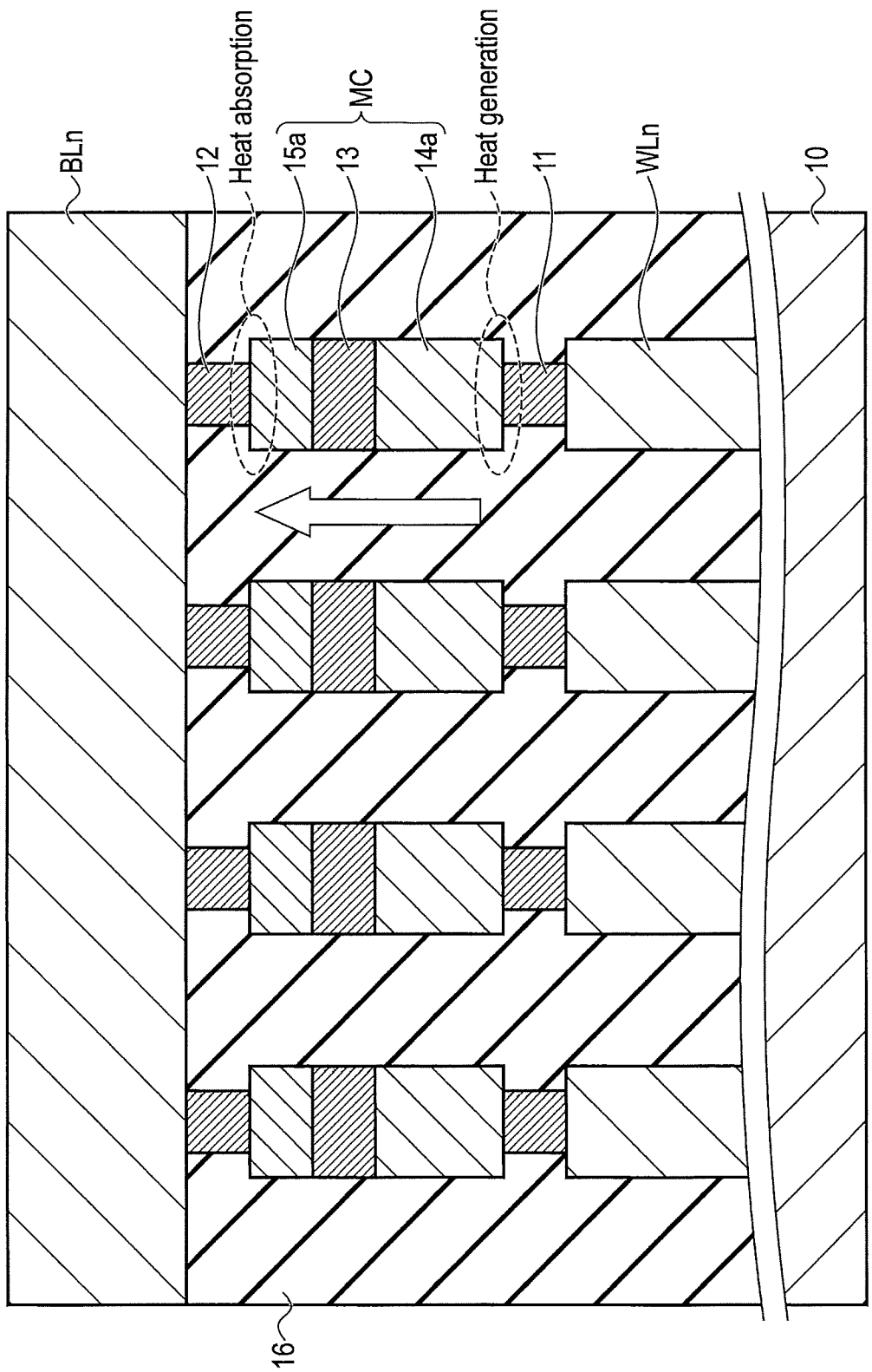
FIG. 13 is a schematic sectional view of a semiconductor storage device according to the third embodiment.

FIG. 13 shows the third embodiment.

In the first and second embodiments, the memory element 14 and the selector 15 are formed of a p-type material.

On the other hand, in the third embodiment shown in FIG. 13, a memory element 14a is formed of an n-type phase-change material, and a selector 15a is formed of an n-type OTS.

More specifically, the memory element 14a is formed of GaSb to which Te is added, for example, and the selector 15a is formed of GeLaSe or GeSeAs, for example. However, the n-type materials are not limited these.

In a data write operation and a reset operation, a voltage applied to the bit lines BLn and the word line WLn connected to the selected cell is opposite to that of the first embodiment. That is, in the (⅓) $V_H$ method shown in FIG. 5, for example, a ground potential (0 V) is applied to the bit line BL2 of the selected cell MC22, and a voltage $V_H$ is applied to the word line WL2. A voltage (⅔) $V_H$ is applied to the bit lines BL1 and BL3 connected to the cells other than the selected cell, and a voltage (⅓) $V_H$ is applied to the word lines WL1 and WL3.

Therefore, current flows from the first electrode 11 to the second electrode 12 of the selected cell MC 22 as shown by an arrow of FIG. 13. Therefore, heat is absorbed at the interface of the second electrode 12 and the selector 15a by the Peltier effect, and heat is generated at the interface of the first electrode 11 and the memory element 14a by the Peltier effect. Impact ionization is promoted at the interface of the second electrode 12 and the selector 15a, and the VI characteristic of the selector 15a shifts to the negative voltage side as shown in FIG. 6A. Therefore, the switching voltage (Vset) of the memory element 14 decreases.

The operation of the n-type memory cell MC is substantially equal to that of the p-type memory cell MC although the direction of current flowing into the memory cell MC is opposite to that of the p-type memory cell MC. Therefore, write efficiency is improved in the selected cell, and write disturb is prevented in the non-selected cells and the half-selected cells.

Note that the third embodiment can be applied to the second embodiment. In that case, the same effect as that produced from the second embodiment can be produced from the third embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
   a first wiring extending in a first direction;
   a second wiring extending in a second direction crossing the first direction;
   a first electrode connected to the first wiring;
   a second electrode connected to the second wiring; and
   a memory cell arranged between the first electrode and the second electrode, wherein
   the memory cell comprises:
      a memory element electrically connected to the first electrode; and
      a selector provided between the memory element and the second electrode and electrically connected to the second electrode, and
   the memory element and the selector are of a same conductivity type.

2. The device of claim 1, wherein one part of the memory element contacts the first electrode, one part of the selector contacts the second electrode, and other part of the memory element is connected to other part of the selector.

3. The device of claim 1, wherein
   part of the first electrode contacts part of the first wiring, and part of the second electrode contacts part of the second wiring.

4. The device of claim 1, further comprising a third electrode between the memory element and the selector.

5. The device of claim 4, wherein a contact surface between the third electrode and the selector is larger than a contact surface between the second electrode and the selector.

6. The device of claim 4, wherein a contact surface between the third electrode and the memory element is larger than a contact surface between the first electrode and the memory element.

7. The device of claim 1, wherein materials of the first electrode and the second electrode have a lower Seebeck coefficient as compared to materials of the memory element and the selector.

8. The device of claim 4, wherein materials of the memory element and the selector have a higher Seebeck coefficient as compared to materials of the first electrode, the second electrode and the third electrode.

9. The device of claim 1, wherein in a write operation, heat is absorbed at the interface of the second electrode and the selector, and heat is generated at the interface of the first electrode and the memory element.

* * * * *